(12) United States Patent
Hasegawa

(10) Patent No.: US 6,677,822 B2
(45) Date of Patent: Jan. 13, 2004

(54) TRANSCONDUCTOR AND FILTER CIRCUIT USING THE SAME

(75) Inventor: Yasumasa Hasegawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/092,541

(22) Filed: Mar. 8, 2002

(65) Prior Publication Data

US 2002/0163384 A1 Nov. 7, 2002

(30) Foreign Application Priority Data

Mar. 14, 2001 (JP) ..................... P2001-072572

(51) Int. Cl.[7] ................................. H03F 3/45
(52) U.S. Cl. ................. 330/258; 330/253; 330/261; 327/552
(58) Field of Search ................. 330/253, 258, 330/261; 327/552

(56) References Cited

U.S. PATENT DOCUMENTS 5,281,924 A * 1/1994 Maloberti et al. .......... 330/253
5,489,872 A * 2/1996 Gopinathan ................ 327/552
5,614,860 A * 3/1997 Osaki et al. ................ 327/552
6,346,856 B1 * 2/2002 Myers et al. ............... 330/252
6,420,932 B1 * 7/2002 Casper ....................... 330/258

OTHER PUBLICATIONS

"Design of a Bipolar 10–MHZ Programmable Continuous–Time 0.05° Equiripple Linear Phase Filter", IEEE Journal of Solid–State Circuits, vol. 27, No. 3, Mar. 1992.

* cited by examiner

Primary Examiner—Henry Choe
(74) Attorney, Agent, or Firm—Rader, Fishman & Grauer PLLC; Ronald P. Kananen, Esq.

(57) ABSTRACT

A filter circuit is provided for suppressing an increase of circuit area, enabling easy circuit design, realizing a reduction of power consumption by a common control voltage operation, and able to stably control the cut-off frequency. The filter circuit includes a differential circuit and a control circuit. The differential circuit includes a first MOS transistor connected to a first current source and a second MOS transistor connected to a second current source. The control circuit controls the out currents of the first and second current source and provides a control signal to the first and second MOS transistors.

9 Claims, 5 Drawing Sheets

FIG.5
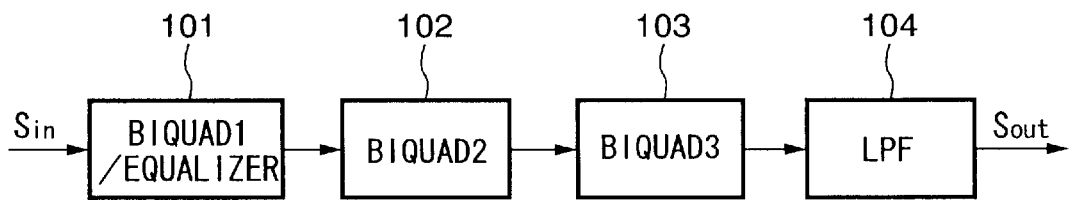
FIG.6
POLE FREQUENCY AND Q FACTOR OF FILTER COMPONENTS
|  | POLE FREQUENCY | Q FACTOR |
|---|---|---|
| BIQUAD1/EQUALIZER | 1.14762 | 0.68110 |
| BIQUAD2 | 1.71796 | 1.11409 |
| BIQUAD3 | 2.3174 | 2.02290 |
| LOW-PASS | 0.86133 |  |
FIG.7
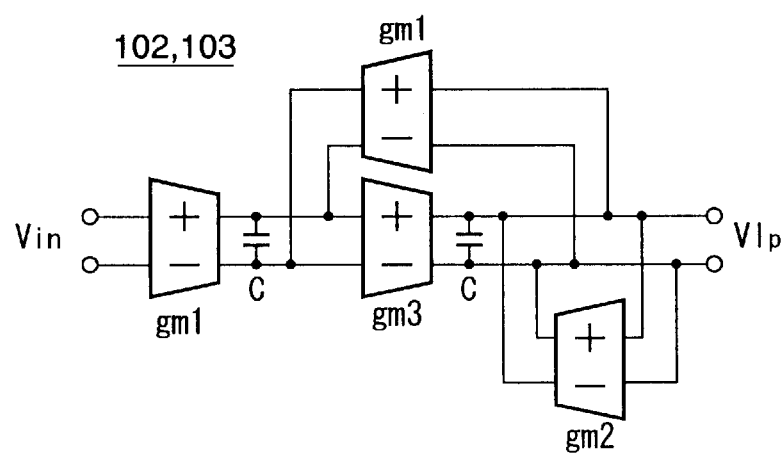

TRANSCONDUCTOR AND FILTER CIRCUIT USING THE SAME

BACKGROUND OF THE INVENTION

1. Field of the Invention

The present invention relates to a filter circuit, more particularly relates to an active filter circuit called a transconductor-C (Gm-C), and a transconductor serving as a component of a filter circuit.

2. Description of the Related Art

In an integrated filter circuit including an active filter, for example, a Gm-C filter, it is desirable to enable easy, linear adjustment of a cut-off frequency $f_c$ while maintaining a Q factor of the filter.

A waveform equalizing technique as represented by partial response-maximum likelihood (PRML) is generally applied to a stored data reproduction system (read channel) for reproducing stored information from an information storage medium such as a magnetic or optical disk. Normally, in a signal waveform reproduced via an optical pickup or a magnetic head from a storage medium, large signal leakage occurs between adjacent bit data; namely, large inter-symbol interface (ISI), such that reproduction of data only by the signal level of the sampling time is difficult. The partial response (PR) technique and other techniques enable high density recording and reproduction combined together with a later stage Viterbi decoding algorithm etc. by permitting ISI for only two to five adjacent sampling times, while eliminating signal leakage in other sampling times.

By taking as an example a magnetic medium wherein a reproduced signal is inherently a differential system, the equalization method used is a differential series such as PR4 (equalizing a write code 1 to three adjacent sample rows 1, 0, and −1), EPR4 (similarly equalizing it to 1, 1, −1, and −1), and EEPR4 (similarly equalizing it to 1, 2, 0, −2, and −1). Specifically, a high frequency enhanced analog low pass filter is used as an equalizer. For example, a 7-pole 2-zero filter comprising a Gm-C biquadratic filter is proposed by Geert A. De Veirman and Richard G. Yamasaki in "Design of a Bipolar 10-MHZ Programmable Continuous-Time 0.05° Equiripple Linear Phase Filter", *IEEE Journal of Solid-State Circuits*, vol. 27, no. 3, March 1992. This filter configuration has the linearity of phase characteristic required by a digital read channel; that is, a good, constant group delay characteristic, and is generally used as an analog equalizing filter.

FIG. 5 is a block diagram of the configuration of the filter.

As shown in the figure, the filter comprises cascade-connected biquadratic filters/equalizers 101 (biquad1/equalizer), 102 (Biquad2), and 103 (Biquad3) and low pass filter (LPF) 104. Note that the biquadratic filter/equalizer 101 has an equalizing function. In the filter configuration shown in FIG. 5, a reproduced signal $S_{in}$ is controlled in gain, then input to the first stage biquadratic filter/equalizer 101 and there adjusted in high frequency boost and equalized. Then, together with the biquadratic filters/equalizers 102 and 103 and the low pass filter 104 connected thereafter, a phase characteristic having a constant group delay is attained. According to Veirman and Yamasaki, the pole frequencies and Q factors of the filter components are as shown in FIG. 6.

The pole frequencies in FIG. 6 are scaled by the cut-off frequency of the equalizing filter. For example, in a read channel having a data rate of 400 Mbps, the cut-off frequency of the equalizing filter becomes about 100 MHZ. As a result, if the cut-off frequency of the equalizing filter is assumed to be 100 MHZ, from FIG. 6, for example, the pole frequency, that is, the cut-off frequency, of the third stage biquadratic filter 103 becomes 231.74 MHZ. Note that the combinations of the pole frequencies and Q factors in FIG. 6, that is, the pole arrangement, are those of "a linear phase filter having a 0.05° equiripple error" well known in filter design, but the invention is also applicable to other combinations of the pole frequencies and Q factors. The pole arrangement here is just an example.

The reproduced data rate of a disk medium differs by about 2.5 times between its inner track and outer track and is required to be adjustable to an optimal cut-off frequency by an external control means. At this time, all of the filter components, that is, the biquadratic filters and the low pass filter, have to have Q factors held at the values indicated in FIG. 6 at all times. Further, the ratios of pole frequencies of the biquadratic filters and the low pass filter have to be the ratios indicated in FIG. 6 regardless of the cut-off frequency of the equalizing filter as a whole. In other words, when adjusting the cut-off frequency of the equalizing filter as a whole in accordance with a change of the reproduced data rate, it is necessary that the component biquadratic filters and the low pass filter be monotonously increased or decreased in pole frequencies while maintaining constant Q factors.

Next, a method of designing the above cut-off frequency and Q factor will be explained by showing an example of the circuits of the components when configuring an equalizing filter by a Gm-C filter.

FIG. 7 shows the basic configuration of the biquadratic filters 102 and 103, while FIG. 8 shows a feed forward pulse slimming configuration used in the biquadratic filter/equalizer 101. Furthermore, FIG. 9 shows the configuration of a primary low pass filter 104.

FIG. 7 shows an example of the configuration of a biquadratic filter having a differential configuration. As shown in the figure, two integrators comprised of Gm-C's are connected in cascade, while a negative feedback loop comprised of another Gm cell is connected to an output terminal thereof. Note that in FIG. 7, the load capacitance C is expressed as a differential capacitance, but generally 2C capacitances are connected between positive and negative signal lines and a ground potential. This is done so that capacitance can easily be set considering the amount of parasitic capacitance, and so that a function of phase compensation capacitance can be easily combined in a common-mode feedback loop.

The transfer function of the biquadratic filters 102 and 103 having the configuration shown in FIG. 7 and used as an equalizing filter is given by the formula below:

$$\frac{Vlp}{Vi} = \frac{g_{m1}g_{m3}/C^2}{s^2 + s(g_{m2}/C) + (g_{m1}g_{m3}/C^2)} \tag{1}$$

Accordingly, the pole frequency $\omega_0$ and Q (quality factor) of a filter are expressed by the formulas below:

$$\omega_0 = \frac{\sqrt{g_{m1}g_{m3}}}{C}, \quad Q = \frac{\sqrt{g_{m1}g_{m3}}}{g_{m2}} \tag{2}$$

FIG. 8 shows an example of the configuration of an equalizing filter comprising an equalizer unit capable of adjusting a high pass boost by a feed forward amplifier K. The transfer function of the equalizing filter is given by the formula below.

$$\frac{Vlp}{Vi} = \frac{(g_{m1}g_{m3}/C^2) - K_s^2}{s^2 + s(g_{m2}/C) + (g_{m1}g_{m3}/C^2)} \quad (3)$$

Similarly, the pole frequency $\omega_0$ and Q of the filter are expressed by the formulas below:

$$\omega_0 = \frac{\sqrt{g_{m1}g_{m3}}}{C}, \quad Q = \frac{\sqrt{g_{m1}g_{m3}}}{g_{m2}} \quad (4)$$

Here, the reason for realizing the high pass boost by the biquadratic filter/equalizer 101 is, as will be understood from FIG. 6, so that high pass boosting can be attained by a relatively small K. Therefore, realization of high pass boosting is not limited to the biquadratic filter/equalizer 101 and can be attained by other biquadratic filters.

FIG. 9 is an example of the configuration of the low pass filter 104. As shown in the figure, the transfer function of the filter is given by the formula below:

$$\frac{Vlp}{Vi} = \frac{(g_m/C)}{s + (g_m/C)} \quad (5)$$

The pole frequency $\omega_0$ can be obtained as below.

$$\omega_0 = \frac{g_m}{C} \quad (6)$$

Realization of an equalizing filter having a constant group delay characteristic and a variable cut-off frequency is attained by setting the pole frequencies $\omega_0$ and Q of the biquadratic filters so as to satisfy the ratios of the pole frequencies and Q factors shown in FIG. 6. It is normally attained by controlling the $g_m$ of the biquadratic filters. According to formulas (1) to (5), it is theoretically possible to make the cut-off frequencies of the filters variable by changing the capacitances C, however, integration of variable capacitors such as varicaps in a standard CMOS production process should normally be avoided since it increases the number of steps in the production process and leads to a rise of costs. Note that in this case as well, it is general practice to change the capacitances connected to the Gm-C integrators in stages of, for example, units of C such as C, 2C, and 3C, or in units of 0.5C so as to coarsely change the cut-off frequency of a filter in a relatively wide range. The $g_m$ value is then controlled to continuously and finely adjust the cut-off frequency.

When the capacitance C is fixed, the two values $\omega_0$ and Q can be determined by adjusting the parameters of $g_{m1}$, $g_{m2}$, and $g_{m3}$. Normally, the general practice is to set $g_{m2}=g_{m3}$ or $g_{m1}=g_{m3}$. By setting $g_{m2}=g_{m3}$, the formulas (2) and (4) can be rewritten to the formulas below:

$$\omega_0 = \frac{\sqrt{g_{m1}g_{m2}}}{C}, \quad Q = \sqrt{\frac{g_{m1}}{g_{m2}}} \quad (7)$$

On the other hand, when $g_{m1}=g_{m3}$, the formulas (2) and (4) can be rewritten as follows:

$$\omega_0 = \frac{g_{m1}}{C}, \quad Q = \frac{g_{m1}}{g_{m2}} \quad (8)$$

In each of the above cases, $\omega_0$ can also be linearly changed while maintaining Q at a constant value by linearly changing all $g_m$'s of the biquadratic filter. For example, if both $g_{m1}$ and $g_{m2}$ are doubled, the cut-off frequency $\omega_0$ can also be doubled while maintaining Q at a constant value.

As will be understood from the above explanation, when designing a Gm-C configuration biquadratic filter and first-order low pass filter, it is preferable that the $g_m$ values of the Gm-C integrators which compose whole filter can be controlled by an external means and can be controlled linearly.

In the related art, a silicon bipolar element has been used for such high frequency filter applications. In a bipolar element, as is well known, the $g_m$ (hereinafter expressed by $g_{m,bip}$ to distinguish it from the $g_m$ of a MOS transistor) is indicated by the formula below:

$$g_{m,bip} = \frac{\partial}{\partial V_{BE}}\left(I_s \exp\frac{V_{BE}}{V_T}\right) = \frac{I_S}{V_T}\exp\frac{V_{BE}}{V_T} = \frac{I_C}{V_T} \quad (9)$$

According to formula (9), the $g_{m,bip}$ of a bipolar transistor is proportional to the collector current $I_C$, so the $g_{m,bip}$ can be linearly changed relatively easily.

On the other hand, a PRML read channel function is inseparable from the above Viterbi decoding and follows digital processing as represented by the Reed Solomon error correction algorithm. There is a strong demand for analog PR equalization in a CMOS production process coexisting on the same die along with such purely digital processing blocks.

As is well known, the $g_m$ of a MOS element (hereinafter expressed as $g_{m,MOS}$ for clarification) is indicated by the formula below:

$$g_{m,MOS} = \frac{\partial}{\partial V_{GS}}(K(V_{GS} - V_{th})^2) = 2\sqrt{KI_D} = 2KV_{eff} \quad (10)$$

Here, $V_{th}$ is the threshold voltage of a MOS transistor, $K=\mu C_{ox}/2L$, and $V_{eff}=V_{GS}-V_{th}$.

When comparing formula (10) and formula (9), the $g_m$ of a bipolar element is linear with respect to the collector current $I_C$, while the $g_m$ of a CMOS element is linear with respect to the square root of the drain current $I_D$. Thus, in the case of a CMOS element, when controlling the $g_m$ by changing the drain current $I_D$ by some external means, it is normally preferable in terms of controllability to provide a conversion mechanism for compensating for the above root characteristic for each of the transconductors and to change linearly from the minimum $g_{m,min}$ to the maximum $g_{m,max}$ in the variable range.

Summarizing the problems to be solved by the invention, in an equalizing filter configured by CMOS elements of the related art, for example, the cut-off frequency of the PR equalizing filter is adjusted by an adjusting means of about 5 to 6 bits width. In this case, a conversion mechanism for correcting the above root characteristic can also be realized by, for example, processing a digital domain by a lookup table such that the root characteristic can be compensated for in an analog domain as well.

However, in any case, this leads to an increase of the circuit area due to the additional circuits and an increase of power consumption and causes deterioration of the filter characteristic itself.

Also, as another disadvantage, when controlling the $g_m$ of a CMOS element by the drain current $I_D$, some kind of linearizing means is generally required. Consequently, there arises a disadvantage that the inherent transconductance of a CMOS element cannot be obtained as a circuit $g_m$. Furthermore, an increase of the circuit area and an increase of power consumption are inevitable.

For example, in a differential circuit comprised of MOS transistors shown in FIG. 10, the $g_m$'s of the MOS transistors can be controlled by a bias current $I_B$. The relationship is expressed by the formula below:

$$I1 - I2 = K(V1 - V2)\sqrt{\frac{2I_B}{K} - (V1 - V2)^2} \quad (11)$$

As shown in formula (11), a non-linear term is included. As a result, linearization by a variety of linearizing means is necessary. The $g_m$'s obtained thereby become much smaller than the inherent $g_{m\_MOS}$ values of the MOS elements indicated in formula (10).

SUMMARY OF THE INVENTION

An object of the present invention is to provide a transconductor and a filter circuit capable of suppressing an increase of circuit area, enabling easy circuit design, realizing a reduction of power consumption by a common control voltage operation, and able to stably control the cut-off frequency.

To attain the above object, according to a first aspect of the present invention, there is provided a transconductor comprising a differential circuit including a first MOS transistor having a gate connected to a positive input terminal, a source grounded, and a drain connected to a first current source supplying a first operation current, and a second MOS transistor having a gate connected to a negative input terminal, a source grounded, and a drain connected to a second current source supplying a second operation current and including a control circuit for controlling the output currents of the first and second current sources in accordance with common-mode output voltage of the differential pair (which is comprised of the first and the second MOS transistors) and a predetermined reference potential.

According to a second aspect of the present invention, there is provided a filter circuit comprising a transconductor-C circuit (Gm-C circuit) including at least two transconductors and a load capacitor driven by the transconductors and a common-mode voltage control circuit for supplying a control signal for setting output common-mode voltage of the transconductors to be identical. Each transconductor includes a first MOS transistor having a gate connected to a positive input terminal, a source grounded, and a drain connected to a first current source supplying a first operation current and a second MOS transistor having a gate connected to a negative input terminal, a source grounded, and a drain connected to a second current source supplying a second operation current.

Preferably, the common-mode voltage control circuit generates the control signal in accordance with common-mode output voltage of the differential pair comprised of the first and second MOS transistors and a predetermined reference potential.

More preferably, the common-mode voltage control circuit generates the control signal so that an average voltage of the output signals output from the differential circuit comprised of the first and second MOS transistors becomes identical to the reference voltage.

Preferably, the common-mode voltage to be input to the gates of the first and second transistors is controlled to a desired transconductance value.

More preferably, the ratios of channel width and channel length of the first and second transistors are set to desired transconductance values.

BRIEF DESCRIPTION OF THE DRAWINGS

These and other objects and features of the present invention will become clearer from the following description of the preferred embodiments given with reference to the accompanying drawings, in which:

FIG. 5 is a block diagram of an example of the configuration of an equalizing filter;

FIG. 6 is a view of pole frequencies and Q factors of filter components;

FIG. 7 is a circuit diagram of the configuration of a biquadratic filter forming part of an equalizing filter;

DESCRIPTION OF THE PREFERRED EMBODIMENTS

Below, preferred embodiments will be described with reference to the accompanying drawings.

Figure 1:
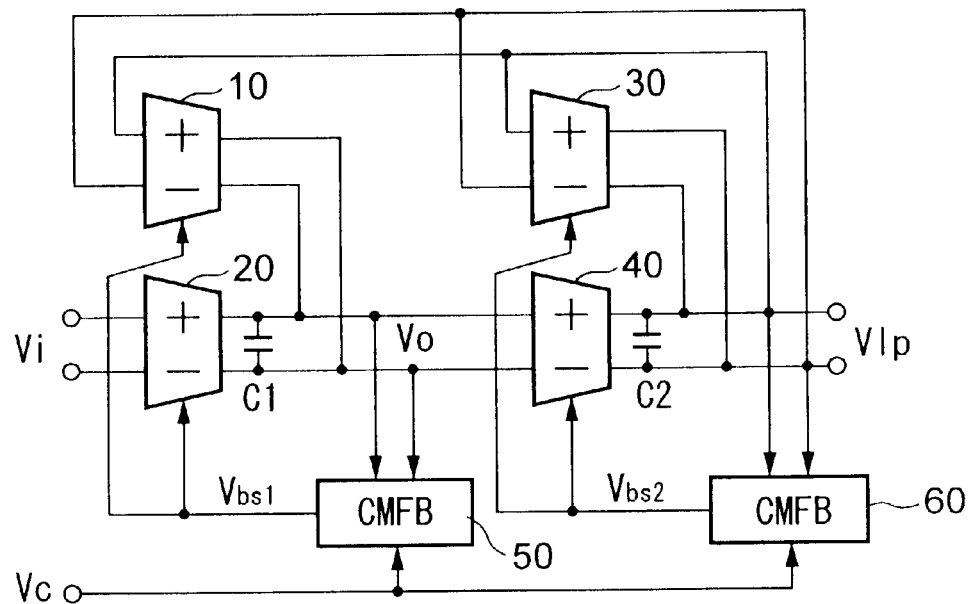
FIG. 1 is a circuit diagram of an embodiment of a filter circuit according to the present invention.

FIG. 1 is a circuit diagram of an embodiment of a filter circuit according to the present invention.

As shown in the figure, a filter circuit of the present embodiment comprises transconductance cells (hereinafter referred to as $g_m$ cells for convenience), capacitors, and bias circuits. Note that the filter circuit is for example a biquadratic filter used as an equalizing filter or a low pass filter.

FIG. 1 shows an embodiment of a biquadratic filter comprised of $g_m$ cells. As shown in the figure, the filter circuit comprises $g_m$ cells 10, 20, 30, and 40 and bias circuits 50 and 60.

The $g_m$ cells 10, 20, 30, and 40 are transconductance cells each comprised of CMOS transistors and formed to have a $g_m$ and Q designed in advance. The bias circuits 50 and 60 are comprised of common mode feedback circuits (CMFB) for supplying common-mode feedback voltages to the cells 10 and 20, and 30, and 40.

The capacitor C1 is driven by the $g_m$ cells 10 and 20, while the capacitor C2 is driven by the $g_m$ cells 30 and 40.

As shown in the figure, the $g_m$ cell 20 and $g_m$ cell 40 are serially connected. An input signal $V_i$ is applied to an input side of the $g_m$ cell 20. An output terminal of the $g_m$ cell 20 is connected to the capacitor C1, while an output terminal of the $g_m$ cell 40 is connected to a capacitor C2. Also, the $g_m$ cell 10 and the $g_m$ cell 20 are connected in parallel and an output signal $V_{1p}$ of the $g_m$ cell 40 is applied to an input terminal thereof. The $g_m$ cell 30 and the $g_m$ cell 40 are connected in parallel and the output signal $V_{1p}$ of the $g_m$ cell 40 is applied to its input side.

Namely, in the filter circuit shown in FIG. 1, the capacitor C1 is a load capacitance of the $g_m$ cells 10 and 20, and the capacitor C2 is a load capacitance of the $g_m$ cells 30 and 40.

Note that in the configuration shown in FIG. 1, the capacitors C1 and C2 forming load capacitances of $g_m$ cells are expressed as differential capacitances, but when generally considering a parasitic capacitance, for example, if the load capacitance is "C", it is preferable that the load capacitances be constituted by 2C capacitors connected between the positive and negative output terminals of the $g_m$ cells and a ground potential. This is done so that the capacitance value can be easily set, and a function of phase compensation capacitance in a common-mode feedback loop, etc. can easily be provided.

The bias circuit 50 generates a bias voltage $V_{bs1}$ in accordance with outputs $V_0$ of the $g_m$ cell 20 and $g_m$ cell 10 and a common-mode voltage setting terminal voltage (control voltage $V_c$) input from the outside and supplies the same to the $g_m$ cells 10 and 20. The bias circuit 60 also generates a bias voltage $V_{bs2}$ in accordance with outputs $V_{1p}$ of the $g_m$ cell 40 and $g_m$ cell 30 and the control voltage $V_c$ input from the outside and supplies the same to the $g_m$ cells 30 and 40.

Note that the bias circuits 50 and 60 generate the bias voltage $V_{bs1}$ and bias voltage $V_{bs2}$ so that an average voltage of the common-mode components of output signals output from the $g_m$ cells is identical to the control voltage $V_c$.

The filter circuit having the configuration explained above utilizes the fact that the $g_m$'s of the CMOS elements change linearly with respect to $V_{eff}=V_{GS}-V_{th}$, namely, makes the $V_{GS}$'s at an operation point of the MOS elements determining the $g_m$'s of the $g_m$ cells a common potential, sets the K's of the MOS elements determining the $g_m$ values, specifically, the channel widths W, in advance for every element so that the biquadratic filters or the low pass filter constituting the filter satisfy the pole frequencies and Q factors indicated in FIG. 6, and then lays out the elements. The cut-off frequency of the filter is adjusted by changing the common potential $V_{GS}$.

Figure 2:
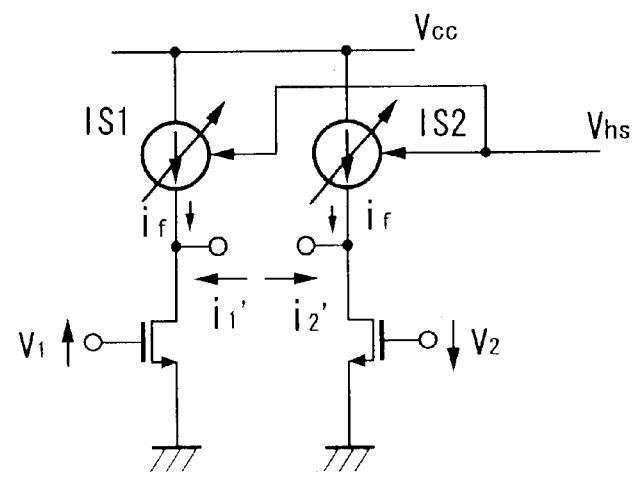
FIG. 2 is a circuit diagram of the configuration of a transconductance cell forming part of a filter circuit of the present invention.

The $g_m$ cells constituting the filter circuit in FIG. 1 can be comprised by differential circuits comprised of MOS transistors as shown in FIG. 2.

As shown in FIG. 2, each $g_m$ cell comprises MOS transistors M1 and M2 and current sources IS1 and IS2 for supplying an operation current to the transistors. Gates of the transistors M1 and M2 are connected to a positive input terminal and a negative input terminal of the $g_m$ cell, while the sources are both grounded. A drain of the transistor M1 is connected to the current source IS1, while a drain of the transistor M2 is connected to the current source IS2. Output currents of the current sources IS1 and IS2 are controlled by a bias voltage $V_{bs}$ supplied from the bias circuit 50 or 60 (for example, $V_{bs1}$ or $V_{bs2}$ shown in FIG. 1). As shown in FIG. 2, the amount of change $i_f$ of the in-phase current component is supplied to the transistors M1 and M2 by the current sources.

In the illustrated $g_m$ cell, the currents $i_1'$ and $i_2'$ are differential currents output by a differential pair of the transistors M1 and M2. Thus, an output differential current $i_{od}$ of the $g_m$ cell is given by the formula below:

$$i_{od} = i_1'(=-i_2') = \frac{i_1'-i_2'}{2} = \frac{i_1-i_2}{2} = K(V_C-V_{th})(v_1-v_2) \quad (12)$$

As will be understood from formula (12), the output differential current $i_{od}$ of a $g_m$ cell changes linearly with respect to the differential input voltage $v_1-v_2$.

As explained above, by constituting a biquadratic filter or a low pass filter by using the $g_m$ cells shown in FIG. 2 and further by constituting the filter circuit (equalizing filter) of the present embodiment shown in FIG. 1, the cut-off frequency of the equalizing filter is controlled by a bias voltage supplied by the bias circuit connected in common to the $g_m$ cells. Furthermore, since the $g_m$ ratios of the $g_m$ cells are kept constant and therefore the Q factors and group delay characteristics of the biquadratic filters and the low pass filter are maintained, the ratios of pole frequencies of the biquadratic filters can be kept constant. Since the $g_m$'s of the $g_m$ cells change linearly with respect to a control voltage input from the outside, a function conversion mechanism is not necessary.

Furthermore, as shown in FIG. 2, by using a differential pair of source-grounded MOS transistors as a $g_m$ cell, a $g_m$ which is theoretically linear with respect to an input amplitude can be obtained.

Below, the operation of the filter circuit of the present embodiment comprised of the above $g_m$ cells will be explained.

The $g_m$ cells 10 and 20 driving the capacitance load C1 are supplied with a bias voltage $V_{bs1}$ by the common bias circuit 50. Due to this, feedback control is performed so that common-mode output voltage of the $g_m$ cells become desired values set by the bias voltage $V_{bs1}$.

Also, similarly, the $g_m$ cells 30 and 40 driving the capacitance load C2 are supplied with a bias voltage Vbs2 by the common bias circuit 60. Due to this, feedback control is performed so that common-mode output voltage in the $g_m$ cells become desired values set by the bias voltage $V_{bs2}$.

Furthermore, as shown in FIG. 1, output terminals of the $g_m$ cells are connected to other $g_m$ cells or, in some cases, to their own input terminals. As a result, input/output terminals of all $g_m$ cells operate at a common-mode voltage. The voltage is set in common by the bias voltage $V_{bs1}$ or $V_{bs2}$ given to the common-mode voltage setting terminals of the $g_m$ cells.

Here, the transconductances $g_{m,MOS}$ of a differential pair of MOS elements, for example, MOS transistors, are given by the above formula (10). According to the formula, it is understood that the $g_m$ of a MOS element changes linearly with respect to a voltage $V_{eff}$ equal to $V_{GS}-V_{th}$, that is, a difference of a voltage $V_{GS}$ between a gate and source of the MOS transistor and its threshold voltage $V_{th}$. The present embodiment uses this characteristic, that is, it uses the bias voltage commonly set by the bias circuits 50 and 60 to be applied between the gates and sources of the MOS transistors of the $g_m$ cells and uses the source-grounded MOS transistors as input transistors of the $g_m$ cell. As a result, a $g_m$ which is linear with respect to a common-mode voltage, that is, the voltage $V_{GS}$ between the gates and sources of the MOS transistors, can be obtained.

Here, the biquadratic filter 103 in FIG. 5 comprising the $g_m$ cells shown in FIG. 2 will be explained. Note that the same explanation can be applied to other components in FIG. 5, for example, the biquadratic filter/equalizer 101, the biquadratic filter 102, and the low pass filter 104.

As shown in FIG. 6, in the biquadratic filter 103, the normalized pole frequency is 2.3174 Hz and the Q factor is 2.0229, that is, Q>1. Therefore, the cut-off frequency can be made smaller in the $g_m$ cell for providing $g_{m1}$ when $g_{m3}=g_{m1}$ than when $g_{m3}=g_{m2}$. This becomes generally advantageous in terms of power consumption. Here, an explanation will be made assuming $g_{m3}=g_{m1}$.

At this time, since $\omega_0=g_{m1}/C$ and $Q=g_{m1}/g_{m2}$, for example, when the cut-off frequency of the overall equalizing filter is set to be 100 MHZ and C=1 pF, $g_{m1}$=1.4553 mS and $g_{m2}$=719.4 $\mu$S. From formula (10), when the sizes of the MOS elements are set so as to satisfy $K_1/K_2$=1.4553/0.7194 by setting $g_{m1}=2K_1\ V_{eff}$ and $g_{m2}=2K_2\ V_{eff}$, the cut-off frequency $f_c$ of the filter circuit can be adjusted by changing the control voltage $V_{eff}$ commonly used by the $g_m$ cells without changing the ratios of the $g_m$ values, that is, the Q factors.

Note that it is necessary that the pole frequencies of the equalizing filters always maintain the ratios shown in FIG. 6, thus the $g_m$ values of all of the $g_m$ cells always have to maintain fixed ratios with each other. Therefore, in the filter circuit of the present embodiment, the K's of the MOS elements for determining the $g_m$ values of the $g_m$ cells, actually, the channel widths W of the MOS transistors, have to be set to the above fixed ratio. By doing so, it is possible to control the cut-off frequency of the overall equalizing filter just by changing the voltage $V_{GS}$ at an operation point or the common-mode voltage commonly used by the $g_m$ cells. Function conversion is not necessary.

Also, when determining the K's of the MOS transistors for determining the $g_m$ values, the channel length L can be made a parameter. However, since there is a tendency toward shorter channels to obtain larger $g_m$ values, the channel lengths L and the $g_m$ values tend to deviate from the proportional relationship due to the short channel effect. Thus, the present invention is not limited to the above. The K's of the $g_m$ cells can be determined either by the channel lengths L or the channel widths W of the MOS elements such that the $g_m$ values can be determined thereby.

Figure 3:
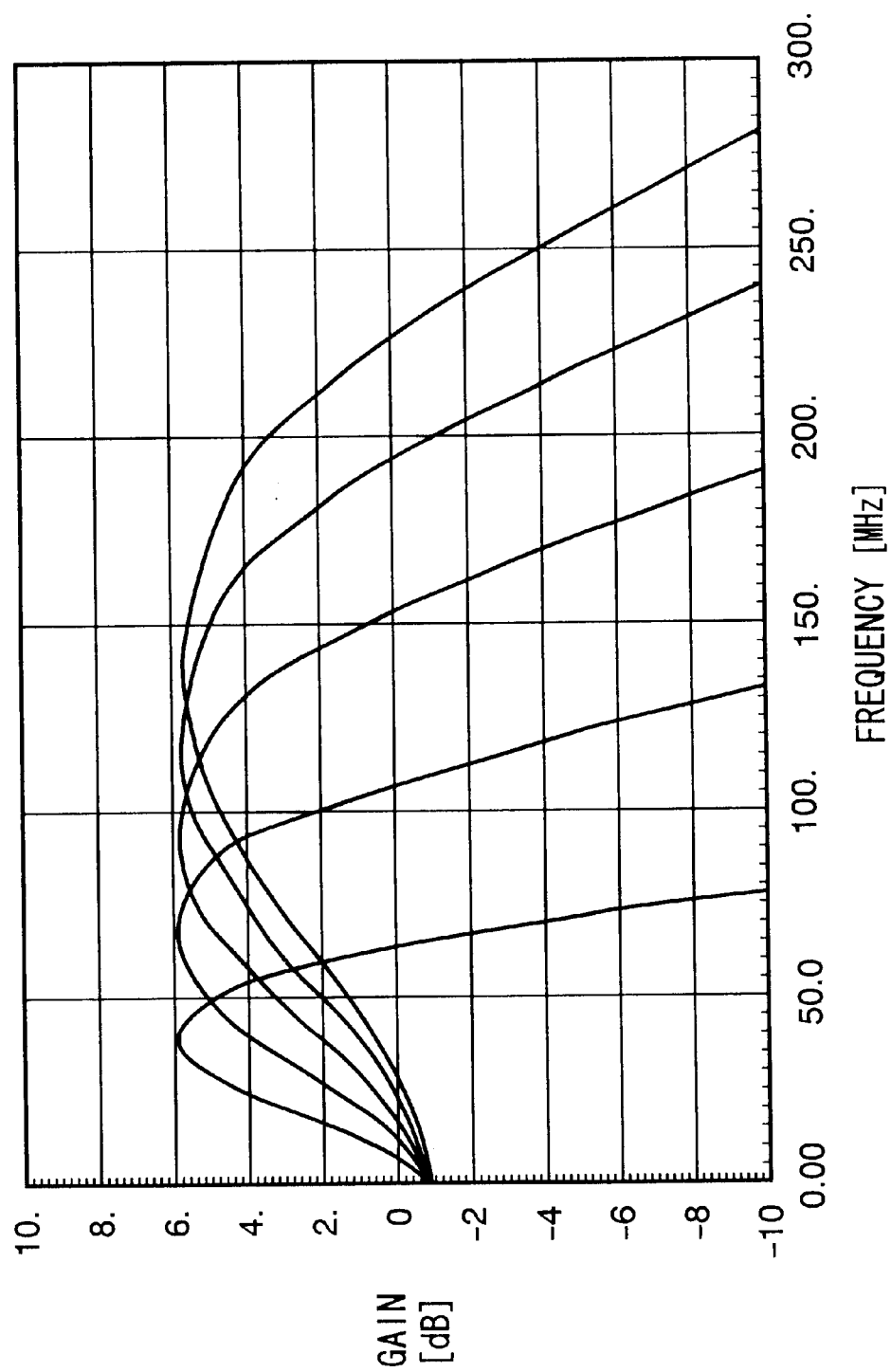
FIG. 3 is a graph of a gain characteristic of a filter circuit of the present invention.

FIG. 3 is a graph of the gain characteristic of a filter circuit of the present embodiment and shows the change of the gain characteristic of the filter when changing a $V_c$ terminal voltage.

Figure 4:
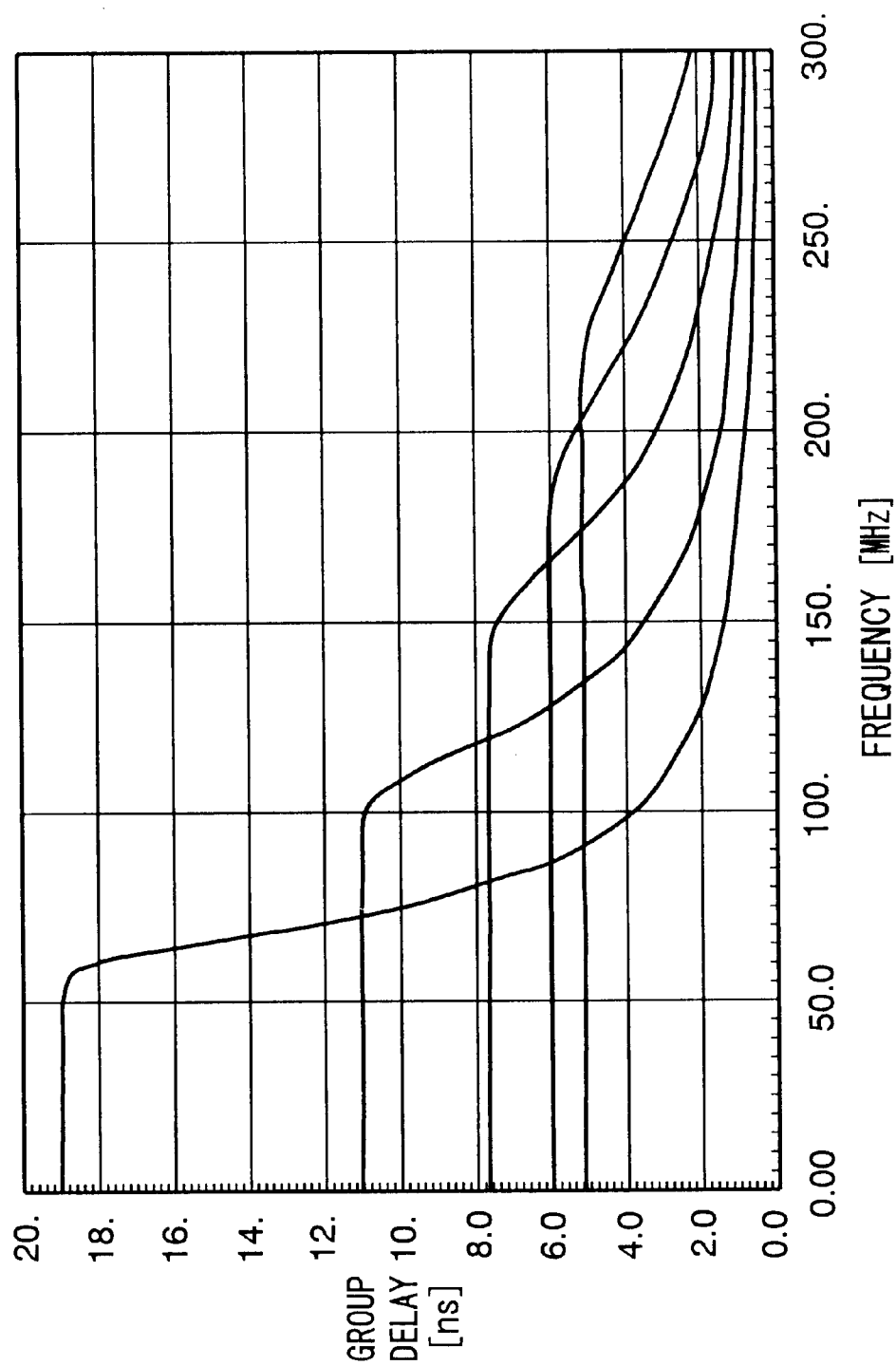
FIG. 4 is a graph of a group delay characteristic of a filter circuit of the present invention.
Figure 8:
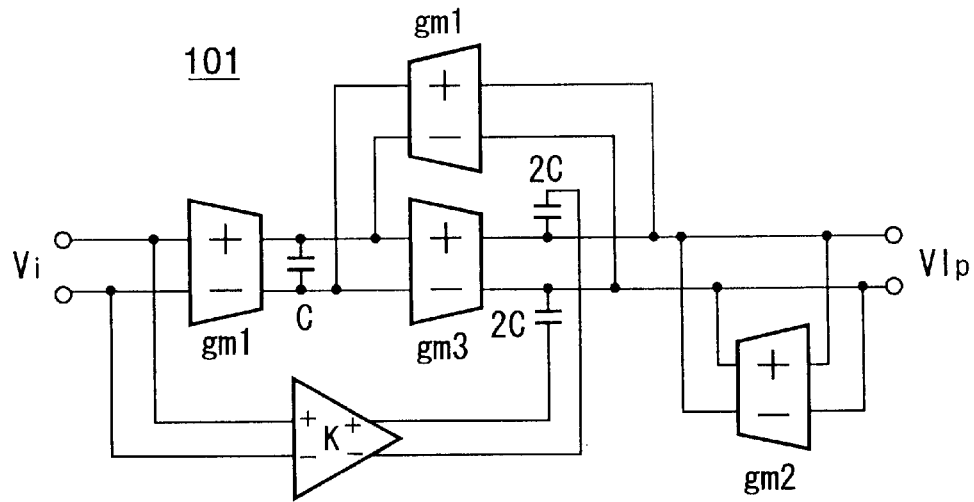
FIG. 8 is a circuit diagram of the configuration of a biquadratic filter/equalizer forming part of an equalizing filter.
Figure 9:
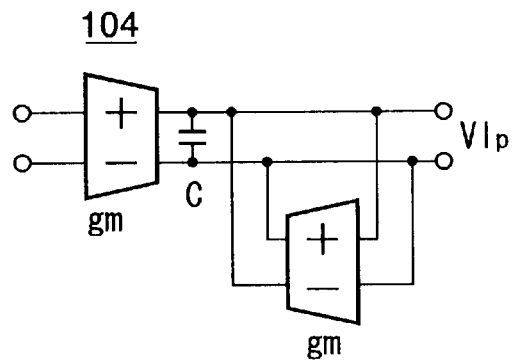
FIG. 9 is a circuit diagram of the configuration of a low pass filter forming part of an equalizing filter.
Figure 10:
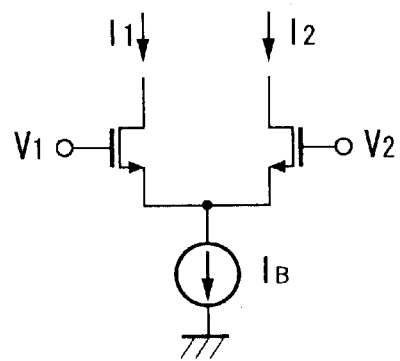
FIG. 10 is a circuit diagram of an example of the configuration of a transconductance cell of the related art.

Also, FIG. 4 is a graph of the group delay characteristic of the filter circuit of the present embodiment and shows the change of the group delay characteristic of the filter when changing a $V_c$ terminal voltage.

Summarizing the effects of the present invention, as explained above, according to the filter circuit of the present invention, the transconductances (gm) of the transconductors of a filter are controlled by a common control voltage. Therefore, the cut-off frequency of the filter circuit can easily be adjusted such that a function conversion mechanism using a lookup table or a function conversion circuit, etc. is totally unnecessary. As a result, it is possible to simultaneously achieve a reduction of circuit area, a reduction of power consumption, and prevention of additional disturbances which may be caused by additional circuits.

Also, in the present invention, the Q factors of the biquadratic filters comprised of the transconductors are kept unchanged since the ratios of gm values between the Gm-C integrators, which become important to achieve the group delay characteristic of the filter, are determined by the ratios of the shape parameters of the MOS elements. In other words, the channel width W and channel length L are not affected by aging etc., so that stable adjustment of the cut-off frequency can be attained.

Furthermore, according to the transconductor of the present invention, the output common-mode voltage becomes the same potential as an externally set common-mode voltage control voltage, and the output common-mode voltage becomes an input common-mode voltage of another transconductor in the next stage or connected to the output terminal thereof, so all transconductors constituting the overall filter operate at an identical common-mode voltage. As a result, distinct advantages are attained such that an operation point of the overall filter circuit can easily be designed, a dynamic range of input and output can be enlarged, and a power consumption can be lowered.

Note that the present invention is not limited to the above embodiments and includes modifications within the scope of the claims.

What is claimed is:

1. A transconductor comprising:
   a differential circuit including a first MOS transistor having a gate connected to a positive input terminal, a source grounded, and a drain connected to a first current source supplying a first operation current, and a second MOS transistor having a gate connected to a negative input terminal, a source grounded, and a drain connected to a second current source supplying a second operation current and
   a control circuit for controlling the output currents of said first and second current sources in accordance with output signals output by said differential circuit and a predetermined reference potential, wherein said control circuit provides a control signal to the first and second MOS transistors.

2. A transconductor as set forth in claim 1, wherein said control circuit controls the output currents of said first and second current sources so that the average potential of said output signals is identical to said reference potential.

3. A transconductor as set forth in claim 1, wherein the common-mode potentials input to the gates of said first and second transistors constituting said differential circuit are controlled to be identical to a desired transconductance value.

4. A transconductor as set forth in claim 1, wherein the ratios of channel width and channel length of said first and second transistors constituting said differential circuit are set to be identical to desired transconductance values.

5. A filter circuit comprising:
   a transconductor-C circuit (Gm-C circuit) including at least two transconductors and a load capacitance element driven by said transconductors and
   a common-mode potential control circuit supplying control signals for setting the output common-mode potentials of said transconductors to be identical,
   wherein said transconductors include a first MOS transistor having a gate connected to a positive input terminal, a source grounded, and a drain connected to a first current source supplying a first operation current and a second MOS transistor having a gate connected to a negative input terminal, a source grounded, and a drain connected to a second current source supplying a second operation current, wherein functions of said common-mode potential control circuit are controlled via an external control signal.

6. A filter circuit as set forth in claim 5, wherein said common-mode potential control circuit generates said control signal in accordance with output signals output from the differential circuit comprised of said first and second MOS transistors and a predetermined reference potential.

7. A filter circuit as set forth in claim 6, wherein said common-mode potential control circuit generates said control signal so that an average potential of output signals output from the differential circuit comprised of said first and second MOS transistors becomes identical to said reference potential.

8. A filter circuit as set forth in claim 5, wherein the common-mode potential to be input to the gates of said first and second transistors is controlled to be a desired transconductance value.

9. A filter circuit as set forth in claim 5, wherein the ratios of channel width and channel length of said first and second transistors are set to be desired transconductance values.

* * * * *